United States Patent [19]
Benning

[11] Patent Number: 5,659,232
[45] Date of Patent: Aug. 19, 1997

[54] METHOD OF DETERMINING THE EFFICIENCY OF ASYNCHRONOUS MOTORS AND APPARATUS FOR CARRYING OUT THE METHOD

[75] Inventor: Wilfried Benning, Herne, Germany

[73] Assignee: Vogelsang & Benning Prozessdatentechnik GmbH, Bochum, Germany

[21] Appl. No.: 689,537

[22] Filed: Aug. 9, 1996

Related U.S. Application Data

[63] Continuation of Ser. No. 339,975, Nov. 15, 1994, abandoned.

[30] Foreign Application Priority Data

Sep. 26, 1994 [DE] Germany ............... 44 34 275.6

[51] Int. Cl.$^6$ ............................................................ H02P 5/28
[52] U.S. Cl. ........................... 318/438; 318/798; 324/545
[58] Field of Search ........................ 318/438, 798–806; 324/140 A, 140 B, 140 C, 140 D, 772, 545

[56] References Cited

U.S. PATENT DOCUMENTS

| | | | |
|---|---|---|---|
| 4,450,398 | 5/1984 | Bose ........................................ | 318/803 |
| 4,922,172 | 5/1990 | Roddy et al. ............................ | 318/490 |
| 5,262,717 | 11/1993 | Bolegoh .................................. | 324/158 MG |
| 5,272,429 | 12/1993 | Lipo et al. ............................... | 318/808 |
| 5,420,523 | 5/1995 | Walker et al. ........................... | 324/772 |
| 5,506,486 | 4/1996 | Hayashi et al. ......................... | 318/808 |

*Primary Examiner*—Brian Sircus
*Attorney, Agent, or Firm*—Friedrich Kueffner

[57] ABSTRACT

In the no-load state of operation of a running asynchronous motor, after separating the no-load copper losses as well as the sum of the iron losses and friction losses and taking into consideration the rated current of the motor and the rated rate of rotation, an upper limiting value of the rated efficiency of the motor is determined while assigning the iron losses and the friction losses to the stator losses and a lower limiting value of the rated efficiency of the motor is determined while assigning the iron losses and the friction losses to the rotor losses. In the loaded state of operation of the running asynchronous motor, while taking into consideration the copper losses resulting from the no-load copper losses, the no-load current, the current input and the rate of rotation of the loaded asynchronous motor, an upper limiting value of the motor efficiency is determined in the actual load condition while assigning the iron losses and friction losses to the stator losses and a lower limiting value of the motor efficiency is determined in the actual load condition while assigning the iron losses and friction losses to the rotor losses. The range of the actual rated efficiency of the motor is defined by the upper and lower limiting values of the rated efficiency of the motor and the range of the actual load efficiency is defined by the upper and lower limiting values of the motor efficiency in the actual load condition.

2 Claims, 1 Drawing Sheet

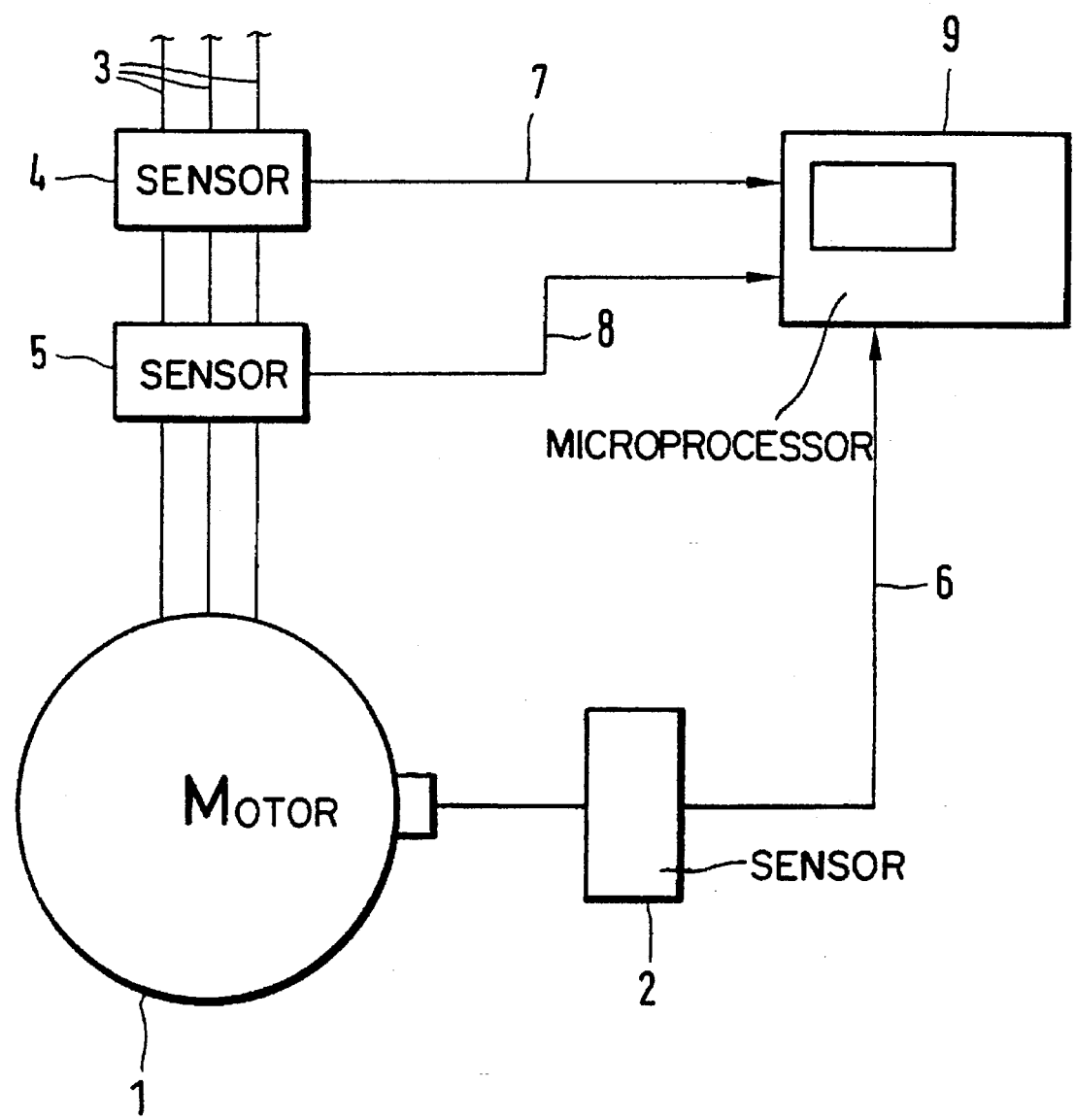

METHOD OF DETERMINING THE EFFICIENCY OF ASYNCHRONOUS MOTORS AND APPARATUS FOR CARRYING OUT THE METHOD

This is a continuation of application Ser. No. 08/339,975 filed Nov. 15, 1994 now abandoned.

BACKGROUND OF THE INVENTION

1. Field of the Invention

The invention relates to a method of determining the efficiency of asynchronous motors.

The invention also relates to an apparatus for carrying out the method.

2. Description of the Related Art

The determination of the efficiency of three-phase asynchronous machines can be carried out by directly measuring the input power and the output power or by determining the output power by means of the loss summation method. These methods are defined in DIN 57 530 Part 2/VDE 0530 Part 2/11.82.

When the input power and the output power are measured directly, the input power is determined by utilizing analog or digital measuring devices for determining the actual power. The output power is computed by measuring the torque and the rate of rotation and the subsequent multiplication in accordance with the formula $P=2 \times \pi \times M \times n$. The efficiency $\eta$ then results as the quotient of output power and input power.

When the efficiency is determined indirectly, initially the no-load characteristic of an asynchronous motor is determined in the no-load test. In that case, the asynchronous motor which runs without load uses from the network only the power necessary for covering the internal losses. These losses are divided into no-load copper losses, the iron losses as well as the friction losses. In accordance with generally known methods, the individual loss portions are then separated from the no-load characteristic. For this purpose, the input of the characteristic $P=f(U)$, $I=f(U)$ takes place; in other words, the asynchronous motor running without loads must be operated at different voltages. Subsequently, the efficiency of the asynchronous motor can be determined with sufficient accuracy for the respective load point during load operation and the rated efficiency can be determined for the rated load point.

Accordingly, the rated efficiency $\eta$ results from the division of the shaft power $P_2$ and the power $P_1$ consumed by the motor. The shaft power $P_2$ is computed from the relationship $P_2 = P_1 - V_{Fe} - V_{Cu} - V_{Zus} - V_{Cu2} - V_{Rbg}$. In this relationship, $V_{Cu2}$ are the rotor copper losses and $V_{Rbg}$ are the friction losses which can be determined from the no-load characteristic. The rotor copper losses $V_{Cu2}$ can be determined from the relationship $s \times P_d$ in which $P_d$ means the air gap power transferred from the motor stator into the rotor and s means the slip in the rated point of the motor. $V_{Fe}$ are the iron losses from the no-load test, while $V_{Zus}$ are the additional losses which, depending on the motor, are in an order of magnitude of between 0.5% and 2% of the power consumed by the motor. The copper losses $V_{Cu}$ are computed from the relationship $1.5 \times I^2 \times R$, wherein R means the terminal resistance of the motor and I means the current consumed by the motor in the rated point.

When utilizing the known methods, it is possible to determine exactly the rated efficiency of an asynchronous motor. However, this determination requires a relatively long time and the use of appropriate measuring devices; in this connection, it should be mentioned that it is sufficient in practical operation of an asynchronous motor to know whether the efficiency is within a certain range. In this manner, a judgment test concerning the economic efficiency of the operated units is obtained which is sufficient in practice.

SUMMARY OF THE INVENTION

Starting from the state of the art, the invention is based on the object of providing a method for determining the efficiency of asynchronous motors and an apparatus for carrying out the method, which ensure that the desired approximate determination of the efficiency can be determined while reducing the requirements of time and technical devices in the laboratory tests as well as in field tests under load.

In accordance with the present invention, a method of determining the efficiency of asynchronous motors is provided, in which, after determining the motor power consumed and the motor current consumed and taking into consideration the motor terminal resistance and the slip, the copper losses, the iron losses, the friction losses and the additional losses are separated, subsequently the shaft power is determined by subtracting the loss portions from the motor power and finally the efficiency is determined by dividing the shaft power by the motor power. In the no-load operating state of the running motor, after separating the no-load copper losses and the sum of the iron losses and friction losses and taking into consideration the rated motor current and the rated rate of rotation, an upper limiting value of the rated efficiency of the motor is determined while assigning the iron losses and friction losses to the stator losses and a lower limiting value of the rated efficiency of the motor is determined while assigning the iron losses and friction losses to the rotor losses, whereas, in the loaded state of operation of the running motor and taking into consideration the copper losses resulting from the no-load copper losses, the no-load current, the current consumption and the rate of rotation of the loaded motor, an upper limiting value of the motor efficiency in the actual load condition is determined while assigning the iron losses and friction losses to the stator losses and a lower limiting value of the motor efficiency in the actual load condition is determined while assigning the iron losses and friction losses to the rotor losses, wherein the range of the actual rated efficiency of the motor is determined by the upper and lower limiting values of the rated efficiency of the motor and the range of the actual load efficiency of the motor is defined by the upper and lower limiting values of the motor efficiency in the actual load condition.

As far as the laboratory test is concerned in this connection, the asynchronous motor is operated at approximately rated voltage and the power consumed without load is measured. The losses are separated into the proportions $V_{Cuo}$ (no-load copper losses) and $V_{Fe+Rbg}$ (sum of the iron losses and friction losses). The rated values of the motor characteristics can be taken from the rating plate of the asynchronous motor.

Initially, the rated efficiency of the motor is determined. The sum of the iron losses and friction losses is assigned to the motor stator. This results in a lower air gap power and, thus, in lower rotor copper losses. Accordingly, a limiting value of the rated efficiency of the motor is determined which is higher than the actual rated efficiency of the motor.

In accordance with a second determination, the sum of the iron losses and friction losses is now assigned to the rotor. This results in an increased air gap power and, thus, in higher rotor copper losses. Consequently, the limiting value of the rated efficiency of the motor is now lower than the actual rated efficiency of the motor.

The sequence in which the above-mentioned determinations are made is insignificant. In any event, the upper limiting value and the lower limiting value then determine the range within which the actual rated efficiency of the motor is.

Therefore, the invention makes possible an approximate determination of the rated efficiency of the motor which is sufficient in practice, even in such a test laboratory in which there is no possibility of operating an asynchronous motor at different voltages.

It is known that the operating costs of the motor operator depend directly from the level of the motor efficiency. For this reason, it is of particular interest to the motor operator to be able to determine, with a view of optimizing the operating costs, the motor efficiency of the asynchronous motors operated by the operator.

Consequently, when determining the efficiency in the field test (asynchronous motor with machine coupled thereto), the power input, the current input and the rate of rotation of the asynchronous motor are first measured in the state coupled to the machine and then in the state uncoupled from the machine. In addition, the winding resistances of the asynchronous motor are determined. The sequence of the measurements can be selected at random.

Following the measurements, the specific evaluation is carried out by initially separating the no-load copper losses and the sum of the iron losses and friction losses from the no-load measurement, as described above in connection with the laboratory test. Subsequently, the following measures are carried out with the aid of the measured data of the coupled machine.

The copper losses $V_{Cu}$ are determined by multiplying the no-load copper losses $V_{Cuo}$ with the square of the quotient of the no-load current $I_o$ and the current input I with the asynchronous motor being coupled to the machine. The air gap power $P_d$ transferred from the stator to the rotor is determined from the relationship of the power $P_1$ consumed by the asynchronous motor minus the copper losses $V_{Cu}$ minus the iron losses $V_{Fe}$ minus the additional losses $V_{Zus}$ which vary depending on the type of motor between 0.5% and 2% of $P_1$. The rotor copper losses $V_{Cu2}$ are computed from the multiplication of the slip s with the air gap power $P_d$ transferred from the stator to the rotor. The slip s is determined from the rate of rotation of the motor when the machine is coupled to the motor.

From the aforementioned relationships it is now possible to determine initially the maximum shaft power $P_{2max}$ from the power consumed by the motor minus the sum of the iron losses and friction losses $V_{Fe+Rdg}$ minus the copper losses $V_{Cu}$ minus the additional losses $V_{zus}$ minus the rotor copper losses $V_{Cu2}$, wherein in this relationship the sum of the iron losses and friction losses is assigned to the stator. The upper limiting value of the motor efficiency in the actual load condition $\eta_{max}$ then results from the division of the maximum shaft power $P_{2max}$ and the power $P_1$ consumed by the motor.

The minimum shaft power $P_{2min}$ is determined from the relationship of the power $P_1$ consumed by the motor minus the copper losses $V_{Cu}$ minus the additional losses $V_{Zus}$ minus the rotor copper losses $V_{Cu2}$ minus the sum of the iron losses and friction losses $V_{Fe+Rbg}$, wherein in this relationship the sum of iron losses and friction losses is assigned to the rotor. Consequently, the lower limiting value of the motor efficiency $\eta_{min}$ is determined from the minimum shaft power $P_{2min}$ divided by the power $P_1$ consumed by the motor.

The actual load efficiency of the motor is then between these two limiting values.

In accordance with the present invention an asynchronous motor is provided with sensors for determining the power input, the current input and the rate of rotation. On the other hand, the sensors are connected to a programmable microprocessor. In the microprocessor, the upper and lower limiting values of the rated efficiency of the motor and of the motor efficiency are determined in accordance with the algorithm determined by the method, so that two efficiency ranges can be made available which are sufficiently exactly determined in practice.

BRIEF DESCRIPTION OF THE DRAWING

In the drawing:

The single FIGURE of the drawing is a schematic diagram of the apparatus according to the present invention.

DESCRIPTION OF THE PREFERRED EMBODIMENT

An asynchronous motor is designated by 1. A sensor 2 for determining the rate of rotation is provided for the asynchronous motor 1. In addition, sensors 4, 5 for measuring the power and for measuring the current are provided in the lines 3 between a voltage source, not shown in detail, and the asynchronous motor 1.

The sensors 2, 4, 5 are connected through lines 6, 7, 8 to a microprocessor 9 which contains a program with an algorithm for determining the upper and lower limiting values of the rated efficiency of the motor and of the motor efficiency.

Accordingly, the microprocessor 9 makes it possible to determine an upper and a lower limiting value of the rated efficiency of the motor as well as an upper and a lower limiting value of the motor efficiency, wherein the ranges of the actual rated efficiency of the motor and the actual load efficiency are defined by the limiting values.

In this connection, the following relationships are important. In determining the rated efficiency of the motor, the following relationships apply:

$P_1$—power consumed by asynchronous motor during no-load

I—current consumed by asynchronous motor during no-load $V_{Cu}$—copper losses

R—terminal resistance of the asynchronous motor $V_{Fe}$—iron losses from the no-load test $V_{zus}$—additional losses (depending on type of motor, between 0.5% and 2% of $P_1$)

$P_d$—air gap power transferred from stator to rotor $V_{Cu2}$—rotor copper losses s—slip at full load $V_{Rbg}$—friction losses, determined from the no-load characteristic $\eta_{max}$—efficiency $P_2$—shaft power The upper limiting value of the rated efficiency of the motor results from the relationship:

$\eta \text{top} = P_2/P_1$ $P_2 = P_1 - V_{Cu} - V_{Fe+Rbg} - V_{zus} - V_{Cu2}$ with $V_{Cu2} = S \cdot P_d$ and $P_d = P_1 - V_{Cu} - V_{Fe+Rbg} - V^{zus}$ $V_{Cu} = 1,5 \cdot I^2 \cdot R$ The lower limiting value of the rated efficiency of the motor results from the relationship $\eta_{bottom} = P_2/P_1$ $P_2 = P_1 - V_{Cu} - V_{Zus} - V_{Cu2} - V_{Fe+Rbg}$ with $V_{Cu2} = s \cdot P_d$ and $P_d = P_1 - V_{Cu} - V_{zus}$ $V_{Cu} = 1{,}5 \cdot I^2 \cdot R$ The actual rated efficiency of the motor is between the limiting values. In determining the limiting values of the motor efficiency, the following meanings apply in the subsequent relationships:

$P_1$—power consumed by the motor in the loaded state
I—current consumed by the asynchronous motor in the loaded state
$V_{Cu}$—copper losses in the loaded state
$I_o$—no-load current
$V_{Fe}$—iron losses from the no-load test
$V_{zus}$—additional motor losses
$P_d$—air gap power transferred from stator to rotor
$V_{Cu2}$—rotor copper losses
s—slip in the loaded state of the asynchronous motor
$V_{Rbg}$—friction losses
$P_{max}$—upper computed value of the shaft power when assigning the iron losses and friction losses to the stator losses
$\eta_{max}$—upper limiting value of the motor efficiency
$P_{2min}$—lower computed value of the shaft power when assigning iron losses and friction losses to the rotor losses
$\eta_{min}$—lower limiting value of the motor efficiency The maximum shaft power results in $P_{2max} = P_1 - V_{Fe+Rbg} - V_{Cu} - V_{zus} - V_{Cu2}$ and, thus, the upper limiting value of the motor efficiency is $\eta_{max} = P_{2max}/P_1$ The minimum shaft power results in $P_{2min} = P_1 - V_{Cu} - V_{zus} - V_{Cu2} - V_{Fe+Rbg}$ and, thus, the lower limiting value of the motor efficiency is $\eta_{min} = P_{2min}/P_1$ The actual motor efficiency is between $\eta_{min}$ and $\eta_{max}$.

I claim:

1. A method of determining the efficiency of an asynchronous motor, comprising:

(a) measuring power consumed and current consumed by the motor during no-load operation of the motor, (b) computing no-load copper losses from the current and winding resistance, (c) subtracting the no-load copper losses from the consumed power resulting in a sum of iron losses and friction losses, (d) subsequently measuring power consumed by the motor during loaded operation of the motor, (e) computing copper losses of the stator by multiplying 1.5 by current squared and by winding resistance, (f) determining in a first approximation step a first approximate value of the efficiency by assuming that the iron losses and friction losses occur in the rotor, so that the rotor copper losses in the first step result from slip multiplied by power consumed minus stator copper losses, subtracting all losses of the first step from the power consumed to determine a first shaft power and dividing the first shaft power by the power consumed, subsequently, (g) determining in a second approximation step a second approximate value of the efficiency by assuming that the iron losses and friction losses occur in the stator, so that the rotor copper losses in the second step result from slip multiplied by power consumed minus stator copper losses minus the sum of iron losses and friction losses, subtracting all losses of the second step from the power consumed to determine a second shaft power and dividing the second shaft power by the power consumed, whereby the efficiency is a value between the first approximate value and the second approximate value.

2. Ant apparatus for determining the efficiency of an asynchronous motor, the apparatus comprising sensors for measuring a rate of rotation, a power input and current input of the motor, further comprising a programmable microprocessor connected to the sensors, wherein the microprocessor comprises means for carrying out the steps of:

(a) measuring power consumed and current consumed by the motor during no-load operation of the motor, (b) computing no-load copper losses from the current and winding resistance, (c) subtracting the no-load copper losses from the consumed power resulting in a sum of iron losses and friction losses, (d) subsequently measuring power consumed by the motor during loaded operation of the motor, (e) computing copper losses of the stator by multiplying 1.5 by current squared and by winding resistance, (f) determining in a first approximation step a first approximate value of the efficiency by assuming that the iron losses and friction losses occur in the rotor, so that the rotor copper losses in the first step result from slip multiplied by power consumed minus stator copper losses, subtracting all losses of the first step from the power consumed to determine a first shaft power and dividing the first shaft power by the power consumed, subsequently, (g) determining in a second approximation step a second approximate value of the efficiency by assuming that the iron losses and friction losses occur in the stator, so that the rotor copper losses in the second step result from slip multiplied by power consumed minus stator copper losses minus the sum of iron losses and friction losses, subtracting all losses of the second step from the power consumed to determine a second shaft power and dividing the second shaft power by the power consumed, whereby the efficiency is a value between the first approximate value and the second approximate value.

* * * * *